(12) United States Patent
Oh et al.

(10) Patent No.: US 7,915,912 B2
(45) Date of Patent: Mar. 29, 2011

(54) SIGNAL LINES WITH INTERNAL AND EXTERNAL TERMINATION

(75) Inventors: Kyung Suk Oh, Cupertino, CA (US); Woopoung Kim, Dallas, TX (US); Huy M. Nguyen, San Jose, CA (US); Eugene C. Ho, Saratoga, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 12/555,886

(22) Filed: Sep. 9, 2009

(65) Prior Publication Data

US 2010/0073023 A1    Mar. 25, 2010

Related U.S. Application Data

(60) Provisional application No. 61/099,646, filed on Sep. 24, 2008.

(51) Int. Cl.
*H03K 17/16* (2006.01)
*H03K 19/003* (2006.01)

(52) U.S. Cl. .................................. 326/30; 365/189.09

(58) Field of Classification Search .............. 326/30; 365/189.09
See application file for complete search history.

(56) References Cited

U.S. PATENT DOCUMENTS

| | | | | |
|---|---|---|---|---|
| 5,548,226 | A * | 8/1996 | Takekuma et al. | 326/30 |
| 5,650,757 | A * | 7/1997 | Barber | 333/128 |
| 5,821,798 | A * | 10/1998 | Tonn, Jr. | 327/333 |
| 5,831,467 | A * | 11/1998 | Leung et al. | 327/319 |
| 5,945,886 | A * | 8/1999 | Millar | 333/1 |
| 6,026,456 | A * | 2/2000 | Ilkbahar | 710/100 |
| 6,347,367 | B1 * | 2/2002 | Dell et al. | 711/170 |
| 6,369,605 | B1 * | 4/2002 | Bonella et al. | 326/30 |
| 6,425,097 | B1 * | 7/2002 | Elachkar et al. | 714/43 |
| 6,587,896 | B1 * | 7/2003 | Baldwin et al. | 710/13 |
| 6,633,178 | B2 * | 10/2003 | Wilcox et al. | 326/30 |
| 6,636,069 | B1 * | 10/2003 | Muljono | 326/30 |
| 7,515,487 | B2 * | 4/2009 | Seo et al. | 365/189.09 |
| 7,692,983 | B2 * | 4/2010 | Lee et al. | 365/198 |
| 7,716,401 | B2 * | 5/2010 | Lee | 710/100 |
| 2002/0118037 | A1 * | 8/2002 | Kim et al. | 326/30 |
| 2003/0020511 | A1 * | 1/2003 | Hirai et al. | 326/30 |
| 2003/0062966 | A1 * | 4/2003 | Abo et al. | 333/33 |
| 2003/0122575 | A1 * | 7/2003 | Jang et al. | 326/30 |
| 2003/0146775 | A1 * | 8/2003 | Levin et al. | 326/30 |
| 2003/0189441 | A1 * | 10/2003 | Nguyen et al. | 326/30 |
| 2003/0234664 | A1 * | 12/2003 | Yamagata | 326/30 |
| 2004/0196064 | A1 * | 10/2004 | Garlepp et al. | 326/30 |
| 2004/0264267 | A1 * | 12/2004 | Nishio et al. | 365/200 |
| 2005/0088200 | A1 * | 4/2005 | Takekuma et al. | 326/30 |
| 2005/0127940 | A1 * | 6/2005 | Takekuma et al. | 326/30 |

(Continued)

*Primary Examiner* — James H. Cho
*Assistant Examiner* — Matthew C Tabler
(74) *Attorney, Agent, or Firm* — Park, Vaughan, Fleming & Dowler LLP

(57) ABSTRACT

Embodiments of a memory controller are described. This memory controller communicates signals to a memory device via a signal line, which can be a data signal line or a command/address signal line. Termination of the signal line is divided between an external impedance outside of the memory controller and an internal impedance within the memory controller. The memory controller does not activate the external impedance prior to communicating the signals and, therefore, does not deactivate the external impedance after communicating the signals. The internal impedance of the memory controller can be enabled or disabled in order to reduce interface power consumption. Moreover, the internal impedance may be implemented using a passive component, an active component or both. For example, the internal impedance may include either or both an on-die termination and at least one driver.

23 Claims, 8 Drawing Sheets

U.S. PATENT DOCUMENTS

| | | | |
|---|---|---|---|
| 2005/0248362 A1* | 11/2005 | Choe | 326/30 |
| 2006/0001443 A1* | 1/2006 | Wang et al. | 326/30 |
| 2006/0053243 A1* | 3/2006 | David et al. | 710/305 |
| 2006/0091900 A1* | 5/2006 | Kang et al. | 326/30 |
| 2006/0255829 A1* | 11/2006 | Kim et al. | 326/30 |
| 2007/0018683 A1* | 1/2007 | Takekuma et al. | 326/30 |
| 2007/0080707 A1* | 4/2007 | Brinkman et al. | 326/30 |
| 2007/0103190 A1* | 5/2007 | Kubo | 326/30 |
| 2007/0126464 A1* | 6/2007 | Vergis et al. | 326/30 |

\* cited by examiner

SIGNAL LINES WITH INTERNAL AND EXTERNAL TERMINATION

RELATED APPLICATION

This application hereby claims priority under 35 U.S.C. §119 to U.S. Provisional Application No. 61/099,646, entitled "Signal Lines with Internal and External Termination," by Kyung Suk Oh, Woopoung Kim, Huy Nguyen and Eugene Ho, filed 24 Sep. 2009.

TECHNICAL FIELD

The present embodiments relate to techniques for communicating information. More specifically, the present embodiments relate to circuits and methods for terminating signal lines using external termination and adaptive internal termination.

BACKGROUND

Memory controllers communicate signals containing data, addresses or commands, to one or more memory devices through signal lines. For the command/address signal lines, many memory systems (such as double-data-rate memory systems) use a daisy-chain or a fly-by topology, in which memory devices are coupled in parallel to multiple signal lines that are each terminated by a corresponding termination impedance. When communicating signals on a given command/address signal line in these memory systems, a separate termination voltage is often applied to the termination impedance (this is sometimes referred to as 'stub series terminated logic' or SSTL). This separate termination voltage is used because multiple memory devices share the given command/address signal line, and the impedances of these memory devices, which are coupled in parallel with the termination impedance, can modify the effective impedance of the given command/address signal line and, thus, the communicated electrical signals. Typically, the termination voltages are provided by an additional voltage regulator, which increases the cost of these memory systems.

DETAILED DESCRIPTION

Figure 1A:
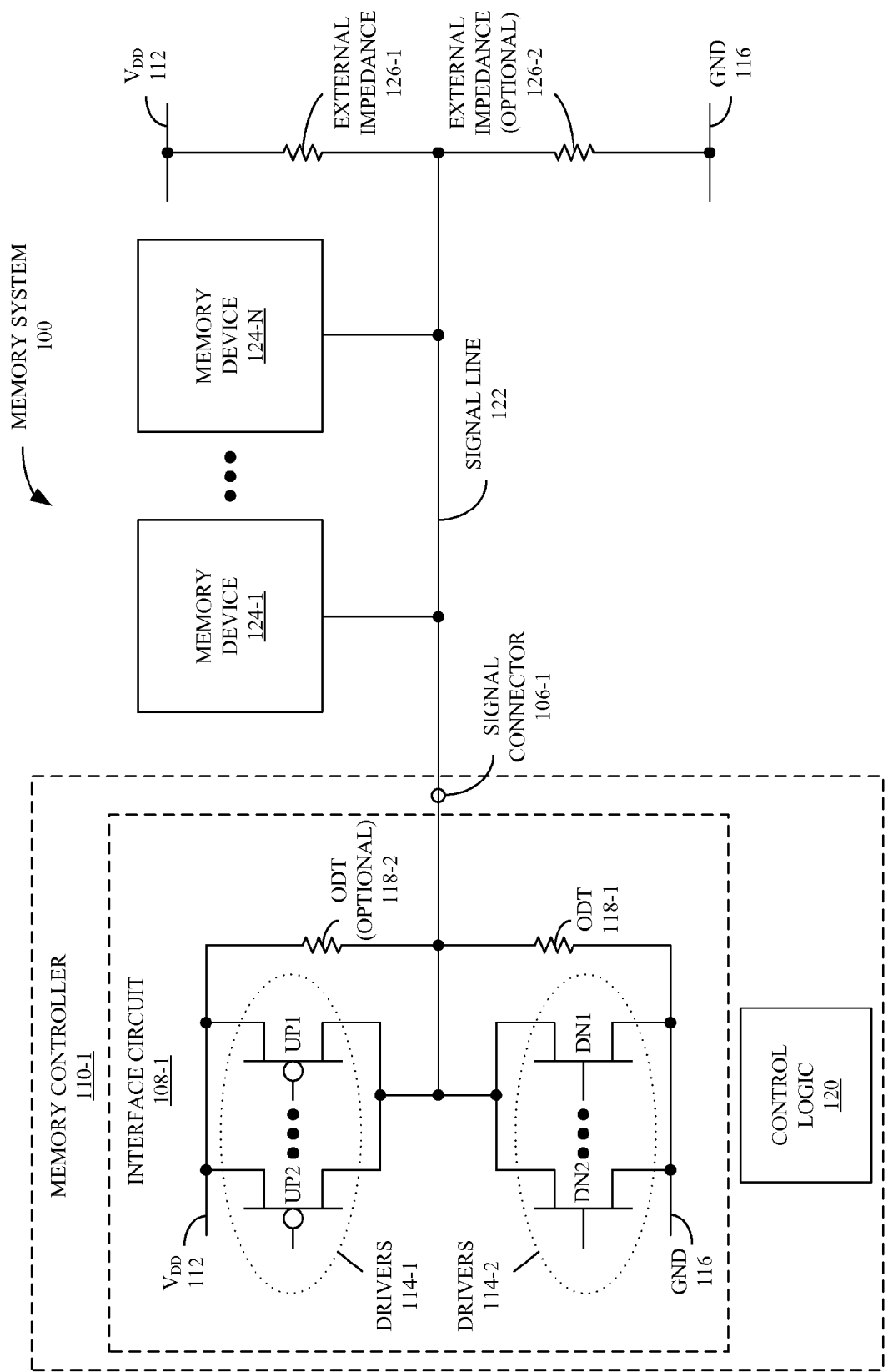
FIGS. 1A-1D are block diagrams illustrating termination of a signal line in a memory system using an external impedance and an adjustable internal impedance in accordance with some embodiments.

FIG. 1A presents a block diagram illustrating termination of a command/address (C/A) signal line 122 in memory system 100 using an external impedance 126-1 and an adjustable internal impedance in memory controller 110-1, such as on-die termination (ODT) 118-1. In memory system 100, memory controller 110-1 is electrically coupled to C/A signal line 122 by signal connector 106-1. Memory controller 110-1 communicates information (in the form of electrical signals) with one or more of memory devices 124, which are arranged in a daisy-chain topology along C/A signal line 122. In particular, one or more of parallel drivers 114-1 in an interface circuit 108-1 pull C/A signal line 122 up to supply voltage ($V_{DD}$) 112 to transmit a logical '1,' and one or more of parallel drivers 114-2 in interface circuit 108-1 pull C/A signal line 122 down to ground (GND) 116 to transmit a logical '0.' The use of the split or divided termination allows the electrical signals to be communicated without applying a separate termination voltage to external impedance 126-1 (which reduces the cost of memory system 100). Instead, external impedance 126-1 is electrically coupled to $V_{DD}$ 112.

Figure 2:
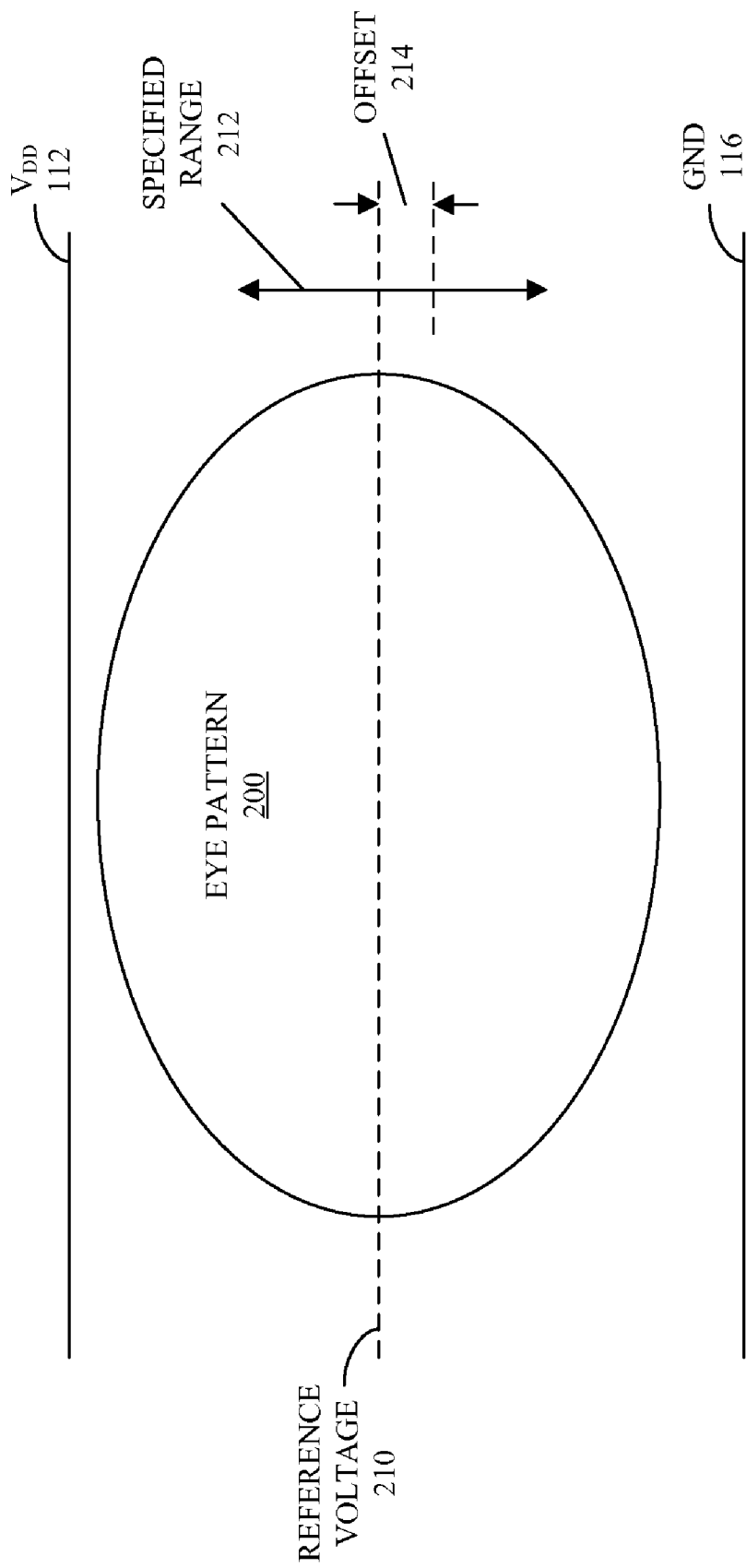
FIG. 2 is a drawing illustrating an eye pattern at a receiver in a memory device in accordance with an embodiment.

This termination configuration (which is sometimes referred to as a split-termination) has comparable DC-power consumption and communication performance to SSTL, such as a comparable voltage margin or error rate. Moreover, as illustrated in FIG. 2, which presents a drawing of an eye pattern 200 at a receiver in one of memory devices 124 (FIG. 1A), the common-mode voltage of the electrical signals corresponds to a receiver reference voltage 210 that is within specified range 212. In this example, reference voltage 210 is offset 214 from the midpoint between $V_{DD}$ 112 and GND 116. However, the combination of the external impedance 126-1 (FIG. 1A) and ODT 118-1 (FIG. 1A) may be selected so that the termination is balanced, i.e., offset 214 is approximately zero. Alternatively, different numbers of drivers 114 (FIG. 1A) can be used to communicate logical 0s and logical 1s to adjust the common-mode voltage of the corresponding electrical signals so that offset 214 is approximately zero (which corresponds to balanced termination) or non-zero (which corresponds to unbalanced termination).

Referring back to FIG. 1A, ODT 118-1 may be a passive component (such as a resistor) that is actively controlled using control logic 120. In particular, control logic 120 may selectively enable ODT 118-1 prior to the communication and may selectively disable ODT 118-1 after the communication. For example, control logic 120 may provide control signals to a switch in series with ODT 118-1 that electrically couples or decouples ODT 118-1 to or from C/A signal line 122. In this way, ODT 118-1 can be electrically decoupled during idle periods, thereby transitioning memory system 100 to a low power-consumption mode.

External impedance 126-1 may be a passive component, such as a resistor, that is external to memory controller 110-1, and which may be external to devices 124. Moreover, memory controller 110-1 may communicate the information without activating external impedance 126-1 prior to the communication, and without deactivating external impedance 126-1 after the communication (which is described further with reference to FIGS. 3A and 3B). This may eliminate the need for memory controller 110-1 to communicate termination control signals or commands to external impedance 126-1, using in-band or side-band communication, prior to the communication.

Figure 1B:
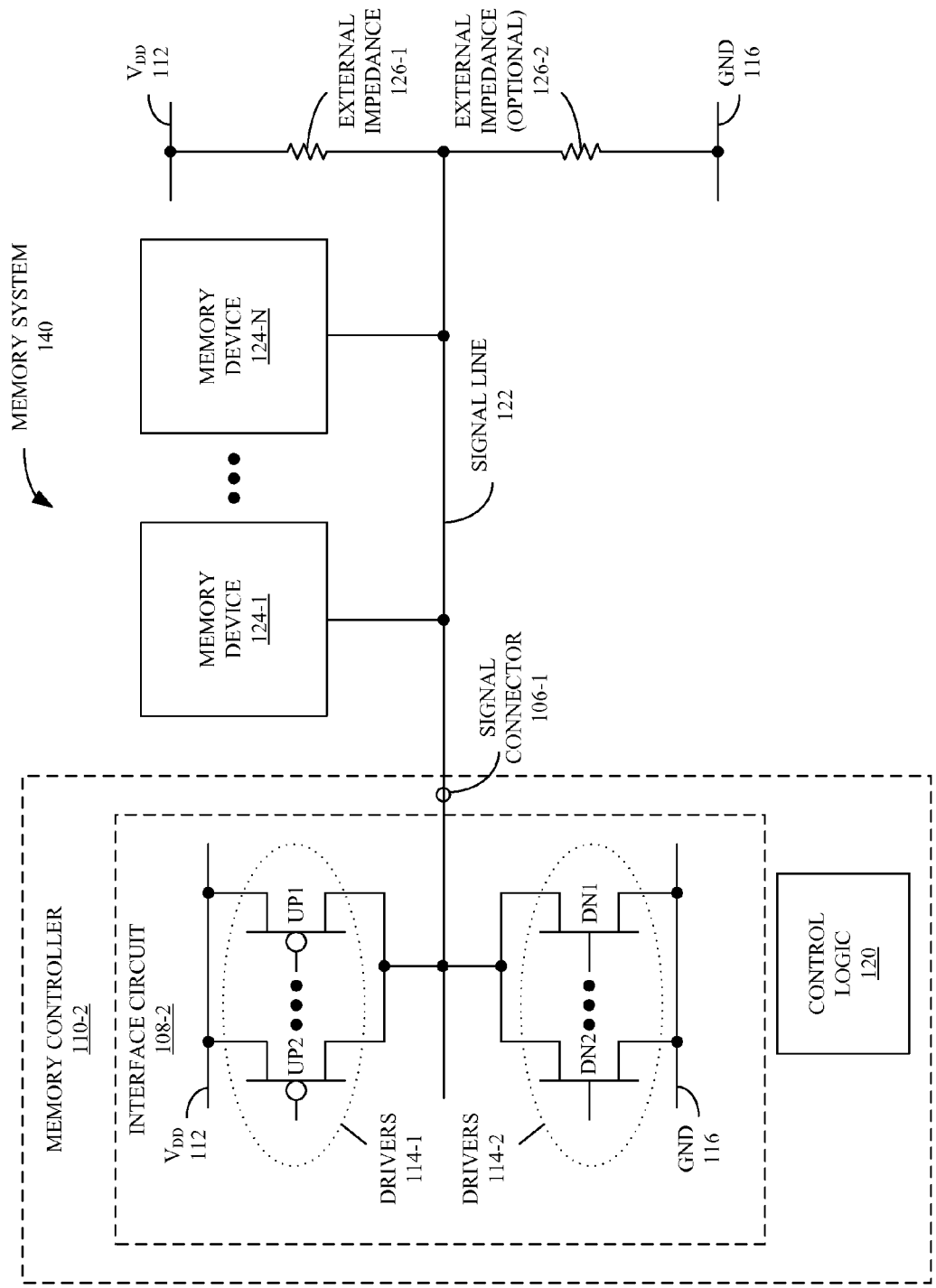

Instead of ODT 118-1, the adjustable internal impedance in memory controller 110-1 may be implemented using one or more active components. This is shown in FIG. 1B, which presents a block diagram illustrating termination of C/A signal line 122 in memory system 140 using external impedance 126-1 (which is electrically coupled to $V_{DD}$ 112) and one or more of drivers 114-2. In particular, the adjustable internal impedance may be implemented by activating one or more of drivers 114-2 while one or more of drivers 114-1 in the interface circuit 108-2 pull C/A signal line 122 up to $V_{DD}$ 112 to transmit a logical 1. (Of course, one or more of drivers 114-2 will also be activated to pull C/A signal line 122 down to GND 116 to transmit a logical 0.) For example, control logic 120 may provide control signals that activate one or more of drivers 114-2 while a logical 1 is transmitted. In an exemplary embodiment, at least one of drivers 114-2 (such as driver DN1) is activated when a logical 0 or a logical 1 is transmitted.

As was the case in memory system 100 (FIG. 1A), in memory system 140 control logic 120 may selectively enable the one or more of drivers 114-2 prior to the transmission of a logical 1, and may selectively disable the one or more of drivers 114-2 after the transmission. In this way, the adjustable internal impedance can be turned off during idle periods, thereby reducing power consumption in memory system 140. Moreover, depending on the number of drivers 114-2 that are activated when communicating logical 0s versus logical 1s, the common-mode voltage (and thus, reference voltage 210 in FIG. 2) of the corresponding electrical signals can be adjusted so that offset 214 (FIG. 2) is approximately zero (which corresponds to balanced termination) or non-zero (which corresponds to unbalanced termination).

As an example, in an embodiment drivers 114 are activated during transmission of electrical signals to set the common-mode voltage, voltage swing and termination in memory system 140. During transmission of a logical 1, one of drivers 114-1 (such as driver UP1) may be activated and may have an impedance of 18Ω, and two of drivers 114-2 (such as drivers DN1 and DN2) may be activated and may have a parallel impedance of 18Ω. For example, the impedance of activated driver DN1 may be 24Ω, and the impedance of activated driver DN2 may be 72Ω. Similarly, during the transmission of a logical 0, one of drivers 114-2 (such as driver DN1) may be activated and may have an impedance of 24Ω. Moreover, external impedance 126-1 may be 90Ω. In this embodiment, the DC-power consumption when transmitting a logical 0 is 25 mW, and the DC-power consumption when transmitting a logical 1 is 37 mW (versus 34.4 mW for each with SSTL). In addition, the resulting eye pattern at a receiver in one of memory devices 124 has approximately the same reference voltage 210 (FIG. 2) as SSTL.

Figure 1C:
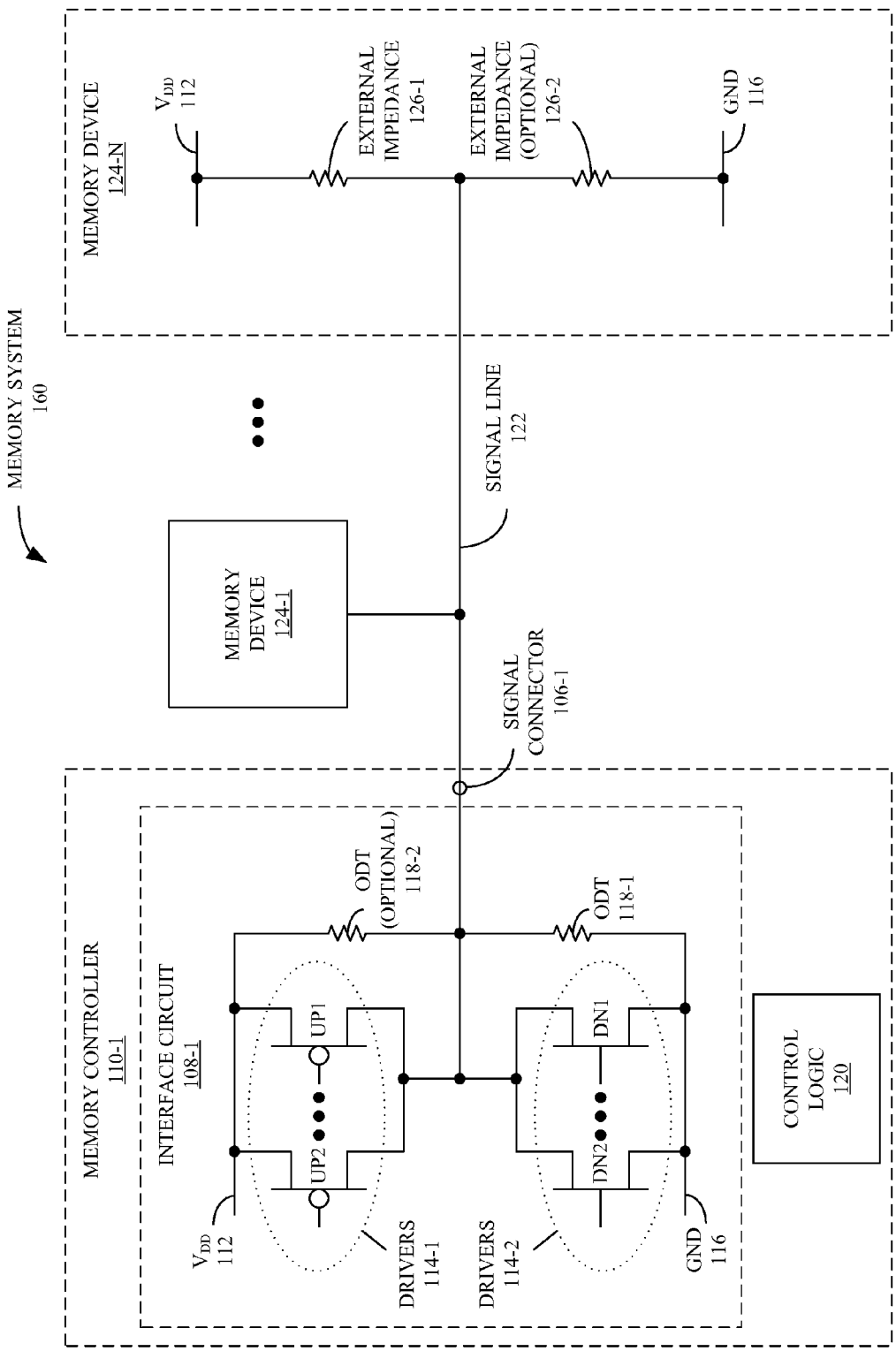
Figure 1D:
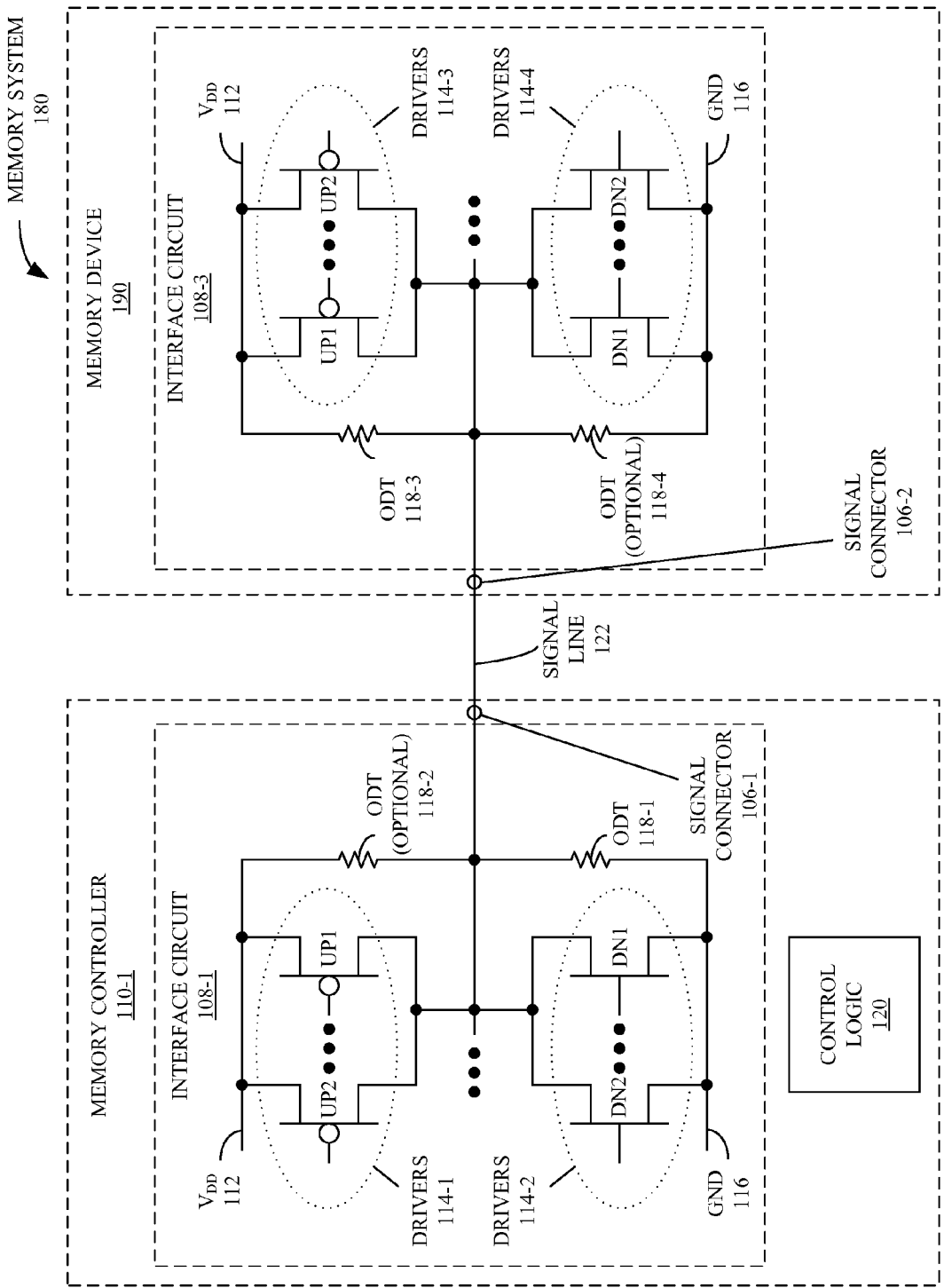

While the preceding embodiments illustrate the split termination with external impedance 126-1 which is external to memory controllers 110 and memory devices 124, in other embodiments the external impedance may be included in one or more of memory devices 124. This is shown in FIG. 1C, which presents a block diagram illustrating termination of a command/address (C/A) signal line 122 in memory system 160 using an external impedance 126-1 which is internal to one of memory devices 124. Another embodiment of this approach is shown in FIG. 1D, which presents a block diagram illustrating termination of C/A signal line 122 in memory system 180 using an impedance which is external to memory controller 110-1 and internal to memory device 190 (such as ODT 118-3) and an adjustable internal impedance in memory controller 110-1 (such as ODT 118-1). In this embodiment, C/A signal line 122 is configured for bidirectional communication (for example, half-duplex or full-duplex communication), and additional receiver circuits in memory controller 110-1 and memory device 190 are not shown. As described further below with reference to FIGS. 3A and 3B, during operation drivers 114-1 and 114-2 in memory controller 110-1 or drivers 114-3 and 114-4 in memory device 190 are selectively disabled.

Various permutations and combinations of the preceding embodiments allow either or both of the adjustable internal impedance and the external impedance to include passive or active components. Thus, in another embodiment active components (such as drivers 114) are used to implement either or both of the external impedance and the adjustable internal impedance in memory system 180.

Moreover, while the preceding embodiments have illustrated the implementation of the split termination using adjustable internal impedance electrically coupled to GND 116 and the external impedance electrically coupled to $V_{DD}$ 112, in other embodiments this may be reversed. Thus, referring back to FIG. 1A, in another embodiment optional ODT 118-2 (which is electrically coupled to $V_{DD}$ 112) is used in conjunction with optional external impedance 126-2 (which is electrically coupled to GND 116), in place of ODT 118-1 and external impedance 126-1. Similarly, in FIG. 1B one or more of drivers 114-1 (which are electrically coupled to $V_{DD}$ 112) may be used in conjunction with optional external impedance 126-2, in place of one or more of drivers 114-2 and external impedance 126-1. In this embodiment, at least one of drivers 114-1 is activated when transmitting a logical 0 or a logical 1. Additionally, in FIG. 1D, optional ODT 118-2 may be used in conjunction with optional ODT 118-4 (which is electrically coupled to GND 116), in place of ODT 118-1 and ODT 118-3.

However, in other embodiments a hybrid configuration is used. For example, in FIG. 1A the adjustable internal impedance may include ODT 118-1 and optional ODT 118-2, and the external impedance may be either external impedance 126-1 or optional external impedance 126-2. Similarly, in FIG. 1B the adjustable internal impedance may include one or more of drivers 114-1 and one or more of drivers 114-2, and the external impedance may be either external impedance 126-1 or optional external impedance 126-2. In this embodiment, at least one of drivers 114-1 and at least one of drivers 114-2 are activated when transmitting a logical 0 or a logical 1.

In some embodiments, the adjustable internal impedance is implemented using a combination of a passive component (such as ODT 118-1 in FIG. 1A) and an active component (such as one or more of drivers 114-2 in FIG. 1B). In addition to allowing the electrical signals to be adjusted, this split-termination configuration partially leverages the drivers, which can save area and can reduce the cost of the memory controller. Alternatively or additionally, a similar approach may be used in those embodiments where the external impedance is implemented in a memory device (such as in memory system 160 in FIG. 1C or in memory system 180 in FIG. 1D), which can save area and can reduce the cost of the memory controller.

In principle, the external impedance can include both external impedance 126-1 and optional external impedance 126-2 (or ODT 118-3 and optional ODT 118-4 in FIG. 1D). This may lead to an increased DC-power consumption.

As noted in the example described previously, drivers 114 may have different strengths. Thus, drivers 114-1 may have different strengths than drivers 114-2. Alternatively or additionally, drivers within either or both of groups of drivers 114 (such as driver DN1 and DN2) may have different strengths. Moreover, drivers 114 may be current-mode or voltage-mode drivers. While the preceding embodiments illustrate single-ended signaling, in other embodiments the split-termination technique may be applied with differential signaling.

Figure 3A:
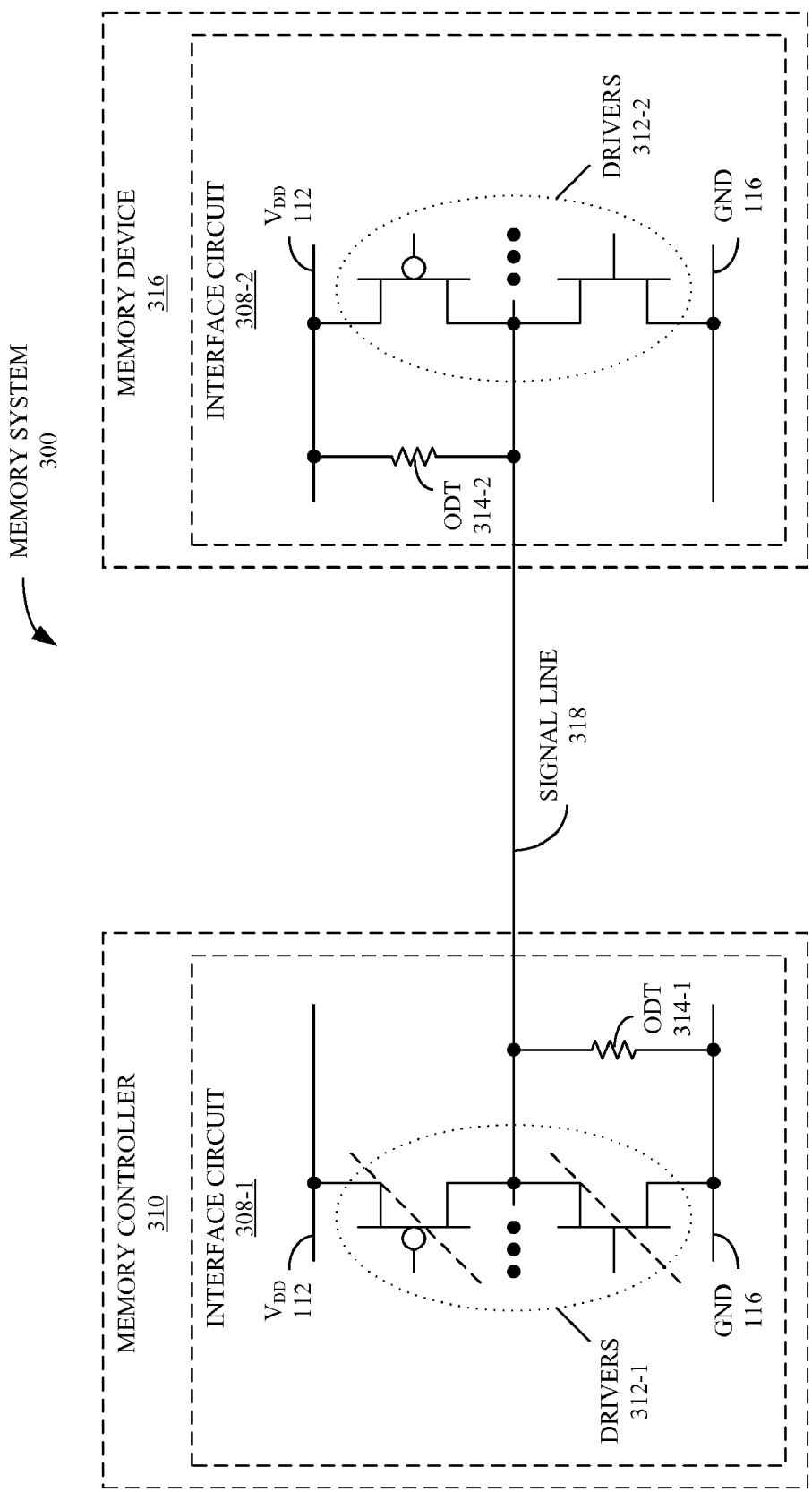
FIGS. 3A and 3B are block diagrams illustrating termination of a data signal line in a memory system during a read operation using an external impedance and an adjustable internal impedance in accordance with some embodiments.

In addition to C/A signal lines, the split-termination technique can be applied to data (DQ) lines in memory systems. FIG. 3A presents a block diagram illustrating termination of a DQ signal line 318 in memory system 300 during a read operation using an external impedance (such as ODT 314-2) and an adjustable internal impedance (such as ODT 314-1). In memory system 300, memory device 316 communicates information (in the form of electrical signals) with memory controller 310. In particular, a pull-up driver in drivers 312-2 in an interface circuit 308-2 pulls DQ signal line 318 up to $V_{DD}$ 112 to transmit a logical 1, and a pull-down driver in drivers 312-2 in the interface circuit 308-2 pulls DQ signal line 318 down to GND 116 to transmit a logical 0. These electrical signals are received by receivers (not shown) in memory controller 310. During the read operation, drivers 312-1 in memory controller 310 may be disabled (as indicated by the diagonal dashed lines). For example, control logic (not shown) in memory controller 310 may provide command signals that disable these drivers. Moreover, DQ signal line 318 may be terminated by ODT 314-1 in memory controller 310 and ODT 314-2 in memory device 316. As was the case in memory system 180 (FIG. 1D), ODT 314-2 may always be enabled, and the control logic (not shown) in memory controller 310 may selectively enable ODT 314-1 prior to the read operation, and may selectively disable ODT 314-1 after the read operation.

Figure 3B:
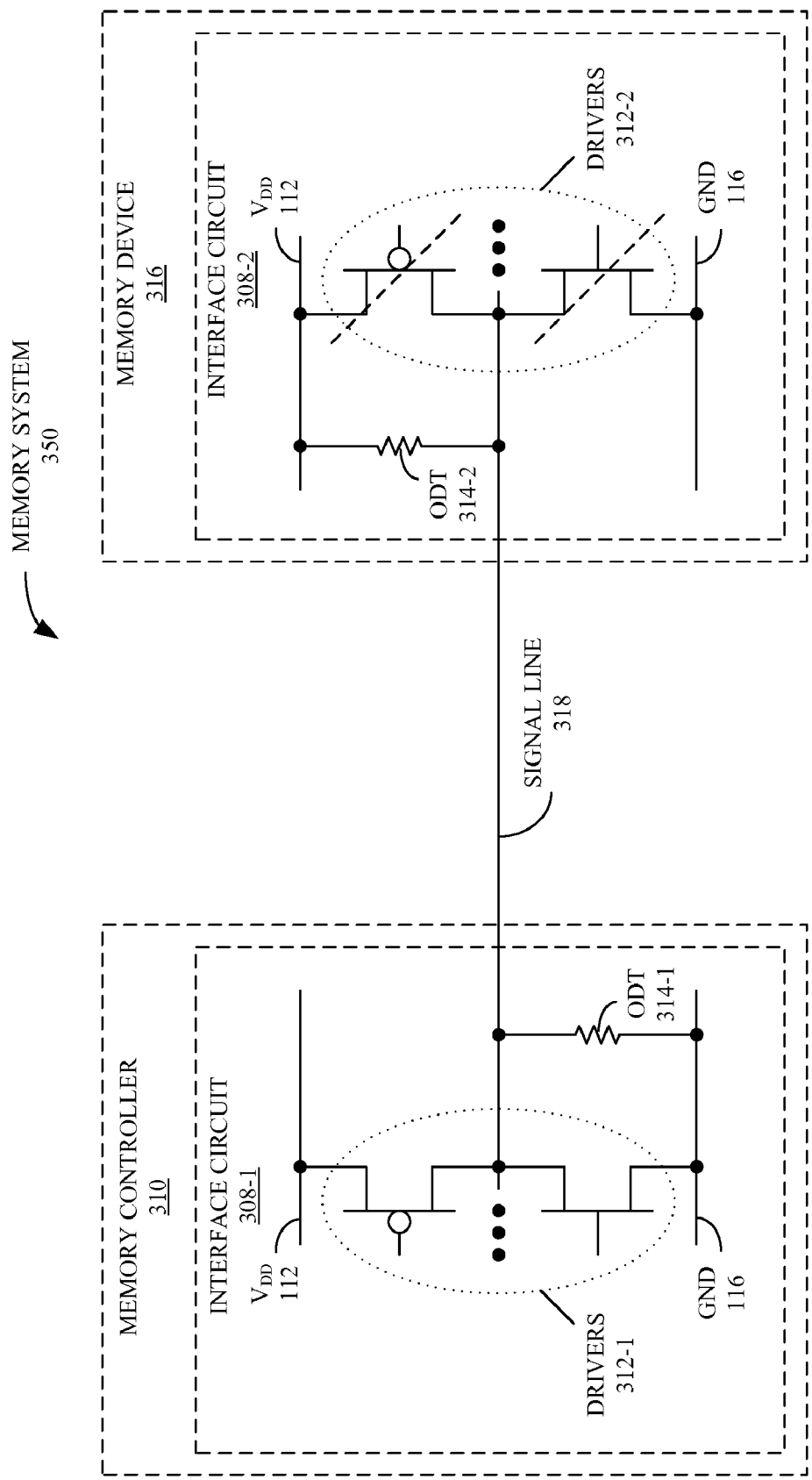

FIG. 3B presents a block diagram illustrating termination of DQ data signal line 318 in memory system 350 during a write operation using an external impedance (such as ODT 314-2) and an adjustable internal impedance (such as ODT 314-1). Because ODT 314-2 is always activated or enabled, memory controller 310 may communicate information (in the form of electrical signals) to memory device 316 during the write operation without activating ODT 314-2 prior to the write operation, and without disabling ODT 314-2 after the write operation. (In this embodiment, drivers 312-2 are disabled during the write operation, as indicated by the dashed lines.) This may eliminate the need for memory controller 310 to communicate termination control signals or commands to memory device 316 (using in-band or side-band communication) prior to the write operation, which may also eliminate the associated synchronization problems.

These embodiments may include fewer components or additional components. Moreover, components can be combined into a single component and/or the position of one or more components can be changed. For example, ODT 314-1 may be electrically coupled to $V_{DD}$ 112 (instead of GND 116) and ODT 314-2 may be electrically coupled to GND 116 (instead of $V_{DD}$ 112). Note that the circuits described in the preceding embodiments can be disposed on one or more integrated circuits.

Figure 4:
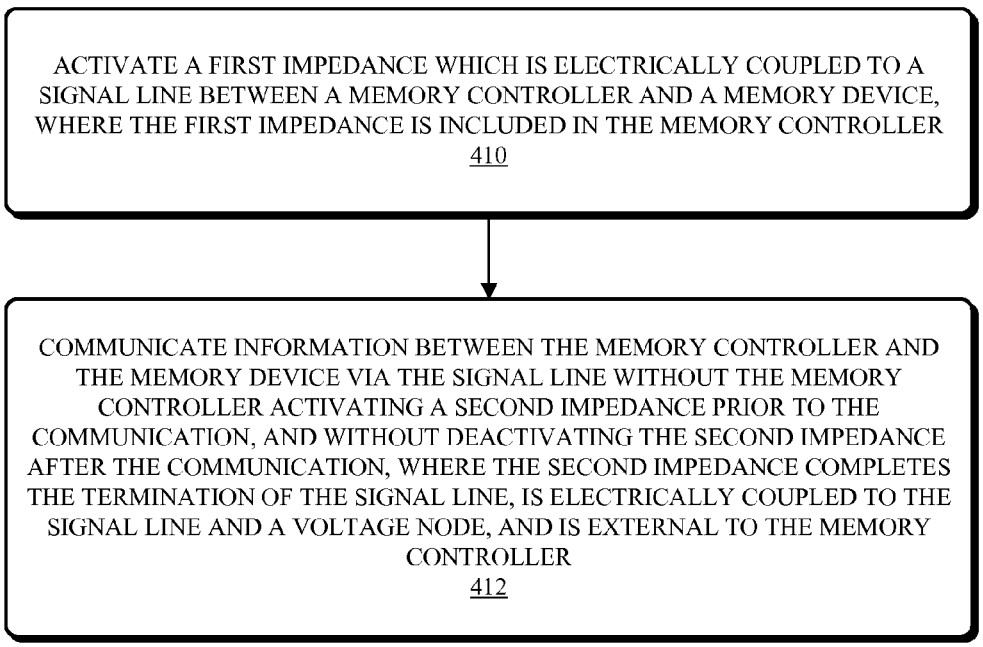
FIG. 4 is a flowchart illustrating communication of information in a memory system in accordance with an embodiment.

FIG. 4 presents a flowchart 400 illustrating communication of information in a memory system that includes a memory controller and a memory device (such as one of memory systems 100 in FIG. 1A, 140 in FIG. 1B, 160 in FIGS. 1C and 180 in FIG. 1D). During operation, the memory controller activates a first impedance which is electrically coupled to a signal line between the memory controller and the memory device (410), where the first impedance is included in the memory controller. Then, information is communicated between the memory controller and the memory device via the signal line (412). This communication occurs without the memory controller activating a second impedance prior to the communication, and without deactivating the second impedance after the communication, where the second impedance, which completes the termination of the signal line, is electrically coupled to the signal line and to a voltage node, and is external to the memory controller.

This embodiment may include fewer or additional operations. Moreover, two or more operations can be combined into a single operation and/or a position of one or more operations may be changed.

The preceding description has been presented to enable any person skilled in the art to make and use the disclosed embodiments, and was provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein. Moreover, the foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A memory controller to be coupled to at least one memory device via a signal line, comprising:
    a signal connector to be coupled to the signal line;
    an interface circuit, electrically coupled to the signal connector, to communicate information with the at least one memory device via the signal line, the interface circuit including a first set of parallel drivers and a second set of parallel drivers, the first set of parallel drivers being coupled between the signal connector and a first voltage node, and the second set of parallel drivers being coupled between the signal connector and a second voltage node; and
    control logic to activate at least one driver of the second set of parallel drivers before the first set of parallel drivers are activated to transmit a logical value to the memory device, the at least one driver of the second set of parallel drivers contributing to a termination impedance.

2. The memory controller of claim 1, wherein the signal line is one of a data (DQ) line and a command/address (CA) line.

3. The memory controller of claim 1, wherein the interface circuit is to transmit and receive information via the signal line.

4. The memory controller of claim 1, wherein the first voltage node is to electrically couple to a supply voltage and the second set of parallel drivers implements a pull-down driver.

5. The memory controller of claim 1, wherein the first voltage node is to electrically couple to ground; and
    wherein the second set of parallel drivers implements a pull-up driver.

6. The memory controller of claim 1, wherein the second set of parallel drivers implements a pull-down driver and the first set of parallel drivers implements a pull-up driver; and
    wherein the first voltage node is to electrically couple to either a supply voltage or ground.

7. The memory controller of claim 1, wherein the at least one driver of the second set of parallel drivers contributes to the termination impedance together with an off-chip impedance which is external to the memory controller.

8. The memory controller of claim 1, wherein the control logic deactivates the at lest one driver of the second set of parallel drivers after the logical value is transmitted.

9. The memory controller of claim 1, wherein the control logic selects a number of the second set of parallel drivers to activate to achieve a predetermined range of values for a common-mode voltage associated with transmitting the information.

10. The memory controller of claim 9, wherein the control logic selects the number of the second set of parallel drivers to activate to achieve one of a balanced termination impedance and an unbalanced termination impedance.

11. The memory controller of claim 10, wherein the control logic adjusts the common-mode voltage by adjusting the number of the second set of parallel drivers.

12. The memory controller of claim 1, wherein the memory controller further comprises at least one passive resistor coupled to the signal line.

13. The memory controller of claim 12, wherein the first voltage node is to electrically couple to a supply voltage; and
wherein the at least one passive resistor is electrically coupled to ground.

14. The memory controller of claim 12, wherein the first voltage node is to electrically couple to ground; and
wherein the at least one passive resistor is electrically coupled to a supply voltage.

15. The memory controller of claim 12, wherein the at least one passive resistor includes a first resistor electrically coupled to ground and a second resistor electrically coupled to a supply voltage; and
wherein the first voltage node is to electrically couple to either the supply voltage or ground.

16. The memory controller of claim 1, wherein the off-chip impedance is associated with at least one passive resistor, which is external to the memory device.

17. The memory controller of claim 7, wherein the off-chip impedance is included in the memory device.

18. The memory controller of claim 7, wherein the memory controller is disposed on an integrated circuit.

19. A memory controller to electrically couple to a memory device via a signal line, comprising:
a signal connector to be electrically coupled to the signal line;
means for communicating information via the signal line, wherein the means is electrically coupled to the signal connector and includes a first set of parallel drivers and a second set of parallel drivers, the first set of parallel drivers being coupled between the signal connector and a first voltage node, and the second set of parallel drivers being coupled between the signal connector and a second voltage node; and
means for activating at least one driver of the second set of parallel drivers before the first set of parallel drivers are activated to transmit a logical value to the memory device, the at least one driver of the second set of parallel drivers contributing to a termination impedance.

20. A system comprising;
a memory device;
a signal line electrically coupled to the memory device; and
a memory controller to electrically couple to a memory device via a signal line, wherein the memory controller includes:
a signal connector to be electrically coupled the signal line;
an interface circuit, electrically coupled to the signal connector, to communicate information with the memory device via the signal line, the interface circuit including an on-chip impedance coupled between the signal connector and a first voltage node, wherein the signal line is coupled to an off-chip impedance that is coupled to a second voltage node; and
control logic to actively control the on-chip impedance before the interface circuit communicates the information to the memory device, the on-chip impedance contributing to a termination impedance together with the off-chip impedance that is external to the memory controller.

21. The system of claim 20, wherein the off-chip impedance is included in the memory device.

22. The system of claim 20, wherein the off-chip impedance includes at least one passive resistor, which is external to the memory device.

23. A method performed by a memory controller for communicating information to a memory device via a signal line, comprising:
activating an on-chip impedance, which is included in the memory controller and is coupled between the signal line and a first voltage node; and
after the on-chip impedance is activated, activating parallel drivers coupled between the signal line and a first voltage node to communicate the information to the memory device via the signal line, wherein the on-chip impedance contributes to a termination impedance together with an off-chip impedance that is external to the memory controller and that is coupled between the signal line and the second voltage node.

* * * * *